United States Patent [19]
Tuchida et al.

[11] Patent Number: 5,259,407
[45] Date of Patent: Nov. 9, 1993

[54] SURFACE TREATMENT METHOD AND APPARATUS FOR A SEMICONDUCTOR WAFER

[75] Inventors: Junichi Tuchida, Kanagawa; Toshiyuki Takamatsu, Chiba, both of Japan

[73] Assignee: Matrix Inc., Chiba, Japan

[21] Appl. No.: 715,421

[22] Filed: Jun. 14, 1991

[30] Foreign Application Priority Data

Jun. 15, 1990 [JP] Japan .................................. 2-155471

[51] Int. Cl.⁵ ................................................ B08B 3/04
[52] U.S. Cl. ..................................... 134/151; 134/155; 134/902
[58] Field of Search ................... 134/151, 76, 902, 155

[56] References Cited

U.S. PATENT DOCUMENTS

| | | | |
|---|---|---|---|
| 4,736,758 | 4/1988 | Kusuhara | 134/76 |
| 4,777,970 | 10/1988 | Kusuhara | 134/902 |
| 4,922,277 | 5/1990 | Carlson | 134/902 |
| 5,169,408 | 12/1992 | Biggerstaff et al. | 134/902 X |

FOREIGN PATENT DOCUMENTS 1-270933  10/1989  Japan .................................. 134/902

Primary Examiner—Frankie L. Stinson
Attorney, Agent, or Firm—Koda and Androlia

[57] ABSTRACT

A wafer surface treatment apparatus and method used in the apparatus including a treatment tank with a cylindrical inside with a bottom, a circular recess formed in the bottom of the tank, a plurality of lower fluid holes opened in the recess, and a horizontally long opening provided at lower part of the side wall of the tank. A movable wall is tightly but slidably installed in the cylindrical inside of the tank so that the movable wall forms a closed room with the recess when it comes into contact with the bottom of the tank. Also, a plurality of upper fluid holes are provided so as to communicate with the closed room, and a rinsing water and washing liquid supply/discharge device is connected to the upper and lower fluid holes. Surfaces of a semiconductor wafer is treated by placing one wafer in the recess, closing the opening, and then spouting a fluid (washing liquid and rinsing water) onto the both sides of the wafer repeatedly while the wafer is floating and rotated by a spouting force of the fluid in the closed room. The fluid used in the treatment is discharged from the tank while the treatment is being performed.

4 Claims, 4 Drawing Sheets

SURFACE TREATMENT METHOD AND APPARATUS FOR A SEMICONDUCTOR WAFER

BACKGROUND OF THE INVENTION

1. Field of the invention

The present invention relates to a method and apparatus for treating or washing a surface of semiconductor wafer, and more particularly, to a method and an apparatus which eliminates impurities such as particles, microbe, bacillus, silica, etc. clinging on the wafer and an exposure material to be used for an etching treatment.

2. Prior Art

As one of conventional surface treatment apparatuses for semiconductor wafers, a wet surface treatment apparatus called "multi-tank batch type" is disclosed, for example, on page 290-293 of *The Handbook of Manufacturing Apparatus for Semiconductor* published by SCIENCE FORUM.

The basic washing process taken in this apparatus includes a step of dip-washing of the wafer with a solution of ammonia hydrogen peroxide heated to 80°, for example, a step of rinsing the solution with pure water, a step of etching by a dilute hydrofluoric acid, a step of rinsing the dilute hydrofluoric acid with pure water, and a step of dip-washing with a solution of hydrochloride hydrogenperoxide heated to 80°. A step of rinsing the wafer with pure water is taken at the end.

Various solutions and pure water used in the steps are stored in individual washing tank. When the wafers are washed, about 25 sheets of semiconductor wafers, for example, are placed in a wafer basket of proper construction (as shown on page 241 of the above-identified prior art) and dipped in each tank according to the washing step.

However, the conventional apparatus has several problems. Since the various solutions and pure water are stored individually in the tanks arranged in the order of process to be taken, a plurality of numbers of tanks are required. For example, the prior art apparatus described above requires at least six tanks, resulting in a large size washing apparatus.

Moreover, one of the today's technical trend is to enlarge the diameter of the semiconductor wafers, and 8″ diameter wafers are now on the market. As a result, large wafer baskets and tanks are inevitably required to treat 25-50 sheets of large wafers at once. For this reason also, a washing apparatus tends to be large in size.

Furthermore, it is difficult for a pure solution to evenly penetrates between wafers in the wafer dipping step, because spaces between the wafers in the wafer basket is very small (for example, about 4.75 mm). This results in uneven washing or etching. When dipping the wafers in the solution, the lower part of each wafer is dipped first and then the upper part. This time lag of the dipping causes another uneven washing. Thus, the uneven washing is more aggravated as the size of the wafers increases.

In addition, although new solutions and new pure water are constantly supplied into the tanks, the solutions and the pure water stored in the tank are not renewed completely at each washing step, and contaminated liquids tend to remain in each tank. As a result, the washing is not accomplished perfectly.

SUMMARY OF THE INVENTION

Accordingly, it is a main object of the present invention to overcome the problems found in the prior art and to provide a surface treatment method and apparatus which enables the size of the apparatus to be small, eliminates uneven washing and improves the washing accuracy.

The object of the present invention is accomplished by a unique method wherein one semiconductor wafer is inserted into a treatment tank through an opening and the opening is closed. Then, a fluid (washing liquid) is blown against upper and lower surface of the wafer, then treating the wafer in a floating and rotating state by a spouting force of the fluid, and discharging the fluid from the treatment tank at the same time as the washing is being performed.

Also, according to the present, invention the surface treatment apparatus includes:

a treatment tank made of anti-corrosion material provided with a cylindrical inside and a circular recess that is substantially coaxial with the cylindrical inside and formed in the bottom, the tank being further provided with a plurality of lower fluid holes opened in the recess and a horizontally long opening provided at a lower part of the side wall, an anti-corrosion movable wall which is tightly but slidably installed in the cylindrical inside of the treatment tank so as to form a closed room with the recess when contacting with the bottom of the treatment tank, a plurality of upper fluid holes being communicated with the closed room, a supply/discharge means for supplying water and washing liquid connected to the fluid holes of the movable wall and the bottom of the treatment tank.

The surface treatment accomplished by the present invention includes one or more treatment steps such as washing with medical liquid, eliminating the exposure material for etching with medical liquid, rinsing with pure water, drying with drying gas, etching of electric circuit onto the wafer, etc. Therefore, fluid according to the present invention includes a liquid such as medical liquid for washing (aqueous solution of medical liquid), pure water, etc., and a gas for drying.

DETAILED DESCRIPTION OF THE INVENTION

Figure 1:
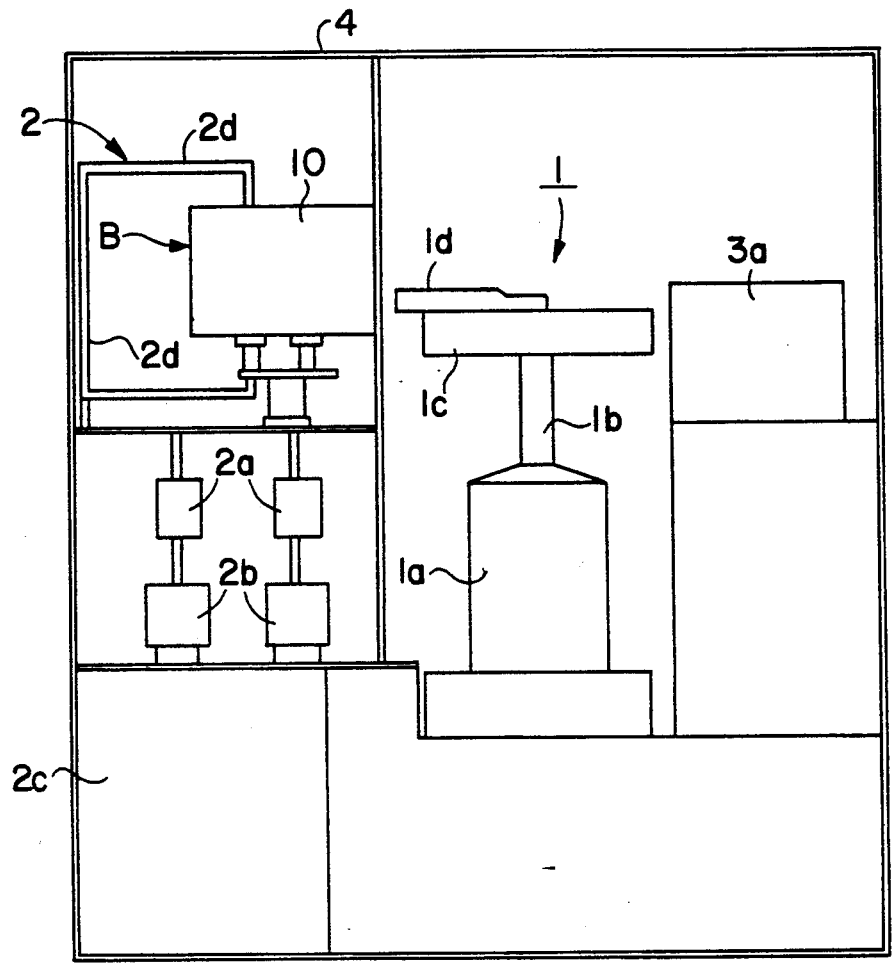
FIG. 1 is a schematic partially sectional side view illustrating the surface treatment apparatus according to the present invention.
Figure 2:
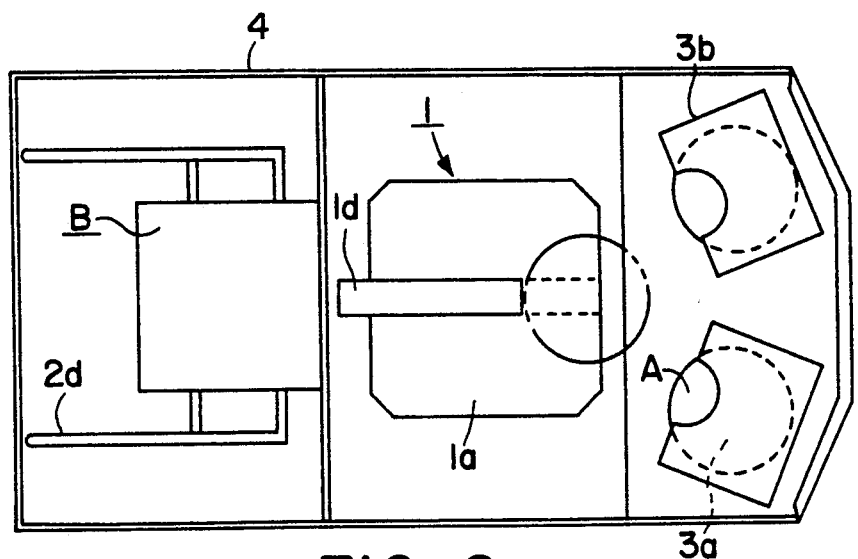
FIG. 2 is a top view illustrating the principal part of FIG. 1.

First, the outline of the structure of the apparatus of the present invention will be described with reference to FIGS. 1 and 2. FIG. 1 shows a schematic view of the surface treatment apparatus, and FIG. 2 is a top view thereof.

A wafer holding mechanism 1, a supply/discharge section 2, wafer baskets 3a and 3b and a treatment section B that comprises the treatment or washing apparatus are all provided in a dust proof casing 4.

The wafer holding mechanism 1 is comprised of a support body 1a, a shaft 1b, a stand 1c and a vacuum pad 1d. The vacuum pad 1d carries the semiconductor wafers. The rotatable shaft 1b is movable vertically on the support body 1a, and the stand 1c is mounted on the top end of the shaft 1b. The vacuum pad 1d is slidable on the stand 1c in a horizontal direction and holds a semiconductor wafer A stored in the wafer basket 3.

The wafer holding mechanism 1 takes out the horizontally stored wafer A from the wafer basket 3a one by one with the use of suction pressure of the vacuum pad 1d and carries the wafer into treatment tank 10 of the treatment section B. After the treatment (washing, etc.), the wafer holding mechanism 1 takes out the treated wafer A from the treatment tank 10 and stores the wafer A in the wafer basket 3b.

The supply/discharge section 2 includes filters 2a, pumps 2b, a tank 2c, pipes 2d and valves (not shown).

The tank 2c includes several tanks for different treatment liquid (not shown). The connections between the treatment liquid tanks and the treatment tank 10 can be switched over by the valves. The treatment liquid stored in the tank 2c is filtered and supplied to the treatment tank 10 by a supply system of the supply/discharge section 2 at the same time as the operation of the supply system. The discharged wasted liquid is discharged into a predetermined reservoir or stored in the tank 2c after being filtered. The supply system can be partially or entirely switched to a discharge system by the valve operation.

Moreover, a supply system (not shown) for drying gas such as nitrogen is also provided.

Figure 5:
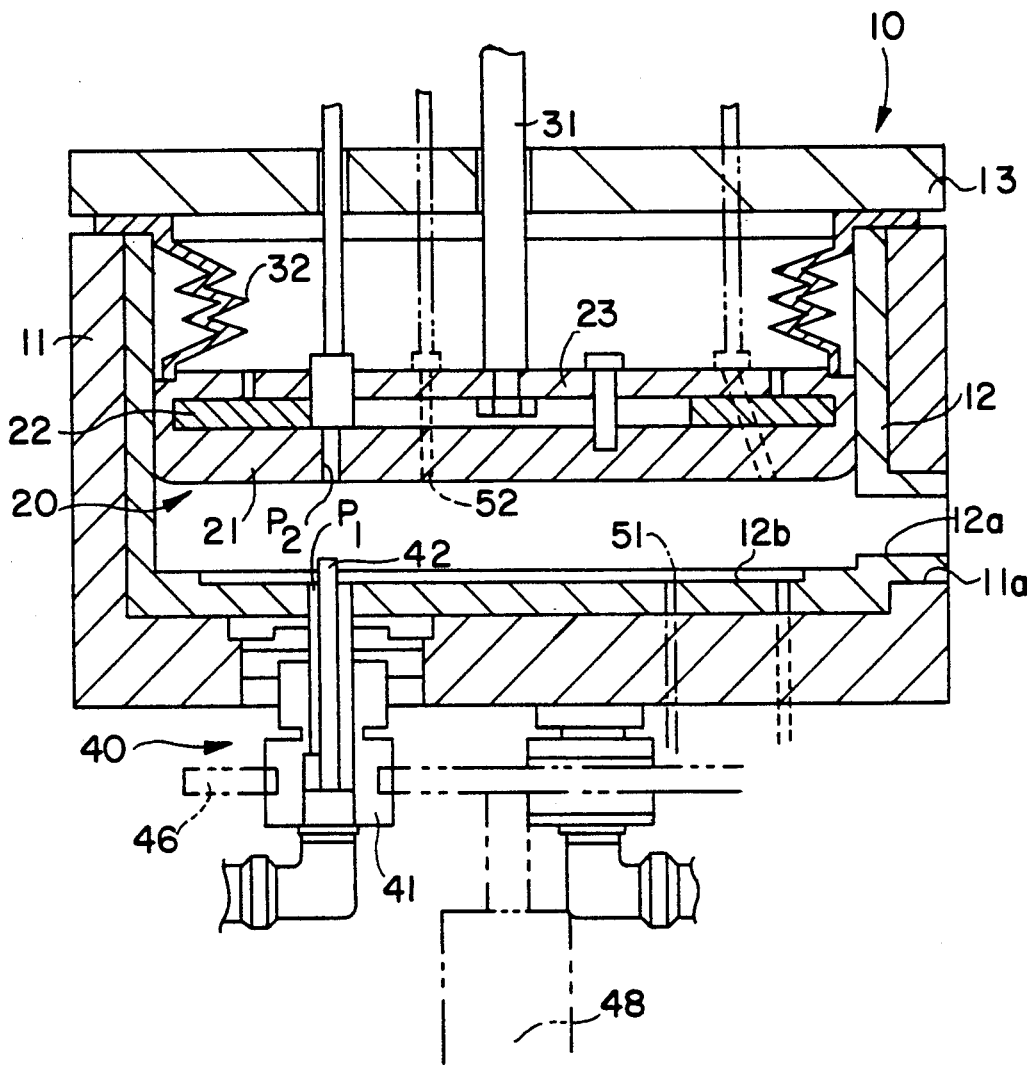
FIG. 5 is a vertical cross sectional view of the treatment tank.

FIG. 5 shows the detail of the treatment section B. The treatment section B is comprised of the treatment tank 10, a movable wall 20, a piston cylinder mechanism 31, a first bellows 32 and a lift member 40.

The treatment tank 10 is a cubic case 11, and a cover 13 is detachably fitted on top of the case 11. Inside the cubic case 11 is provided an inner casing 12 made of an anti-corrosion synthetic resin (registered trade mark "TEFLON").

Figure 3:
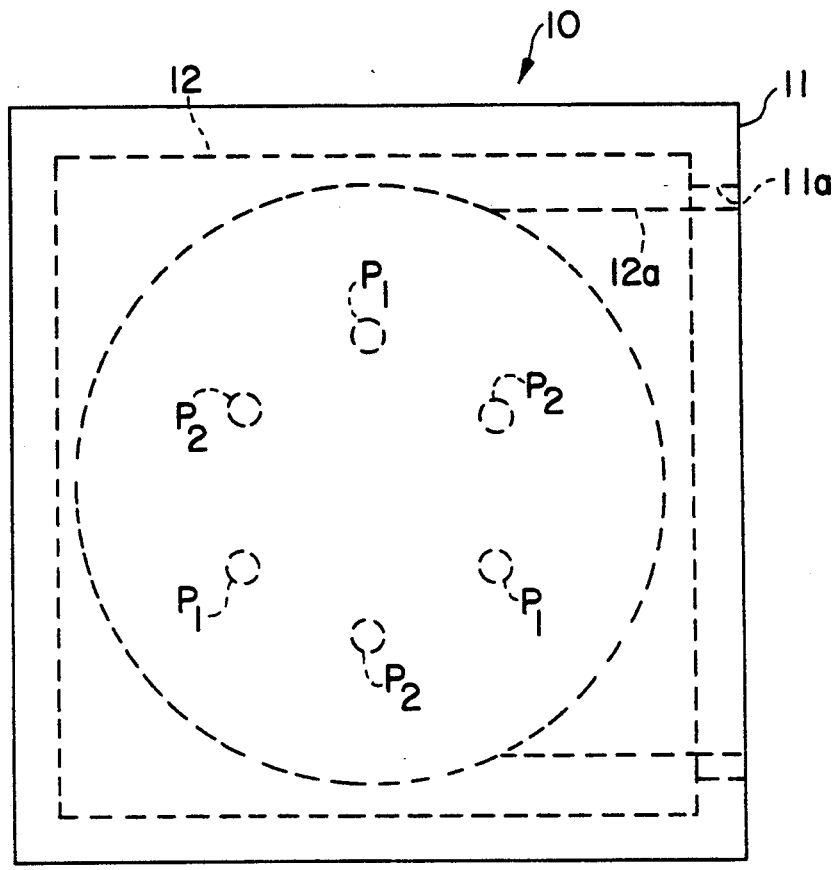
FIG. 3 is a top view of the treatment tank used in the apparatus.
Figure 4:
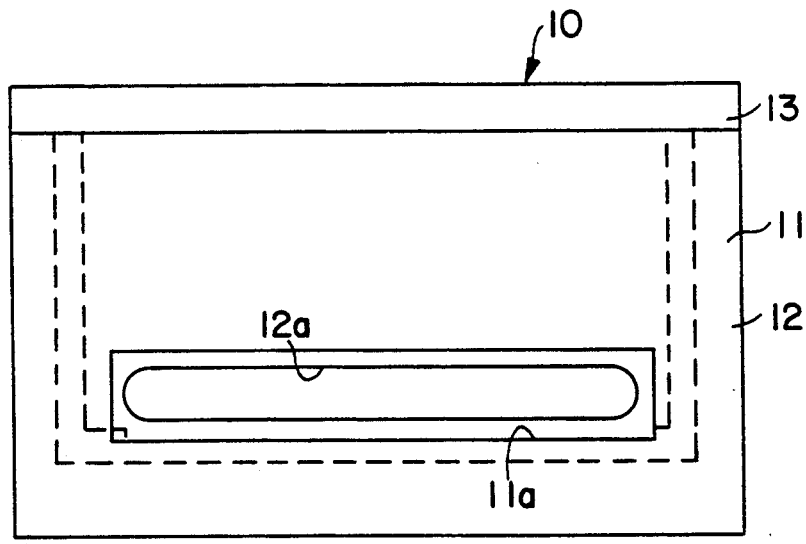
FIG. 4 is a side view thereof.

As shown in FIGS. 3, 4 and 5, the inner casing 12 has a cubic shape on its outside, and the inside is cylindrical shape with a bottom. A circular recess 12b is coaxially (relative to the cylindrical inside of the inner casing) formed in the bottom wall of the inner casing 12. The diameter of the circular recess 12b is smaller than the diameter of the inner casing 12.

A plurality of lower fluid holes P1 (three as shown in FIG. 3) are provided in the recess 12b. These holes P1 are provided on a same circumferential circle with equal distance between them. At a lower part of the side wall of the case 11 is provided a horizontally long opening 11a. For connecting the opening 11a and the cylindrical inside of the casing 12, an opening 12a is opened in the inner casing 12. The inner surface of the opening 11a of the case 11 is covered with anti-corrosion synthetic resin which forms a part of the inner casing 12.

The movable wall 20, which is comprised of a circular wall body 21, a reinforcement plate 22 and a pressing plate 23, is tightly but slidably installed in the cylindrical inside of the inner casing 12. The movable wall 20 is moved like a piston.

When the movable wall 20 is moved down, the movable wall 20 and the recess 12b of the inner casing 12 form a watertight closed room. The circular wall body 21 that is made of anti-corrosion synthetic resin (registered trade mark "TEFLON") is reinforced by the reinforcement plate 22 which is a metallic circular ring and the pressing plate 23 fixed on the upper side of the reinforcement plate 22.

The bottom end of a piston rod of a piston cylinder mechanism 31 is secured to the upper side of the pressing plate 23. A plurality of upper fluid holes P2 (three holes shown in FIG. 3) opened in the wall 20 are provided on a same circumferential circle with equal distance so that the holes P2 are positioned between two lower fluid holes P1. The fluid holes P1 and P2 are connected to the supply/discharge section 2 so as to supply the treatment liquid to the treatment tank 10.

At least one of each upper and lower fluid holes P2 and P1 incline against the bottom surface of the recess 12b so that a circumferential component force is generated onto the semiconductor wafer by the ejection of the fluid.

The first bellows 32 is made of corrosion resistance material. The bellows 32 is provided between the circumferential edge of the movable wall 20 and the top of the inner casing 12. Upper end portion of the first bellows 32 is held between the upper edge of the inner casing 12 and the cover 13. Thus, the cover 13 is securely fitted to the top of the inner casing 12.

Figure 6:
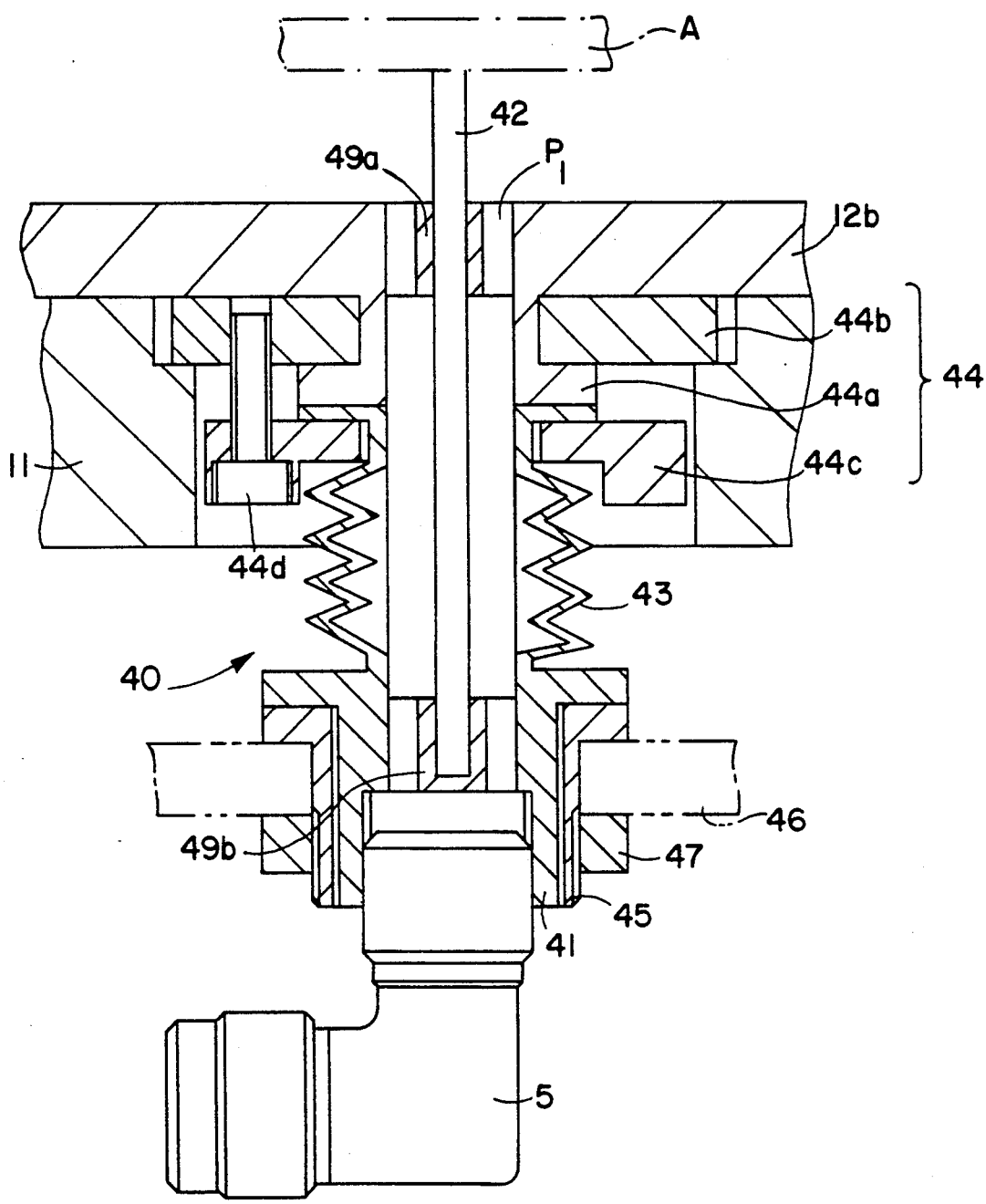
FIG. 6 is a cross sectional view of the lifting means provided under the treatment tank.

As shown in FIGS. 5 and 6, the lift member 40 is comprised of a lift body 41, a support pin 42, a second bellows 43, a connecting member 46 and a piston cylinder 48.

The support pin 42 is provided in the lower fluid holes P1. The upper portion of the support pin 42 is supported by a first passage member 49a, and the lower portion of the support pin 42 is fixed to a second passage member 49b.

The lift body 41 has the second bellows 43 and is provided so as to surround the lower fluid hole P1, and a connecting pipe 5 is fixed to the inside of the lift body 41. The lift body 41 is fitted to the connecting member 46 which is connected to the piston cylinder 48 by means of a reinforcement ring 45 and mounting nut 47.

The upper part of the second bellows 43 is connected to the under surface of flange 44a of the inner casing 12 by a mounting plates 44b and 44c and bolt 44d.

When the piston cylinder 48 is actuated, the connecting member 46, the lift body 41, the connecting pipe 5 and the second passage member 49b are moved upwardly. As a result, the upper end of the support pin 42 projects inside the inner casing 12 so that the pin 42 supports thereon the under surface of the semiconductor Wafer A as shown in FIG. 6.

The operation of the above-described apparatus will be explained.

First, the vacuum pad 1d approaches the wafer basket 3a and holds a wafer A at the bottom end. At this time, the height of the vacuum pad 1d is adjusted so as to mate the number of wafers.

Next, the vacuum pad 1d holds the wafer A from the wafer basket 3a as shown by two dotted line in FIG. 2, and the vertical shaft 1b is rotated. As a result, the vacuum pad 1d rotates to the treatment section B and then adjusted the height. Thus, one wafer is moved to the front of the opening 11a of the treatment section B.

The vacuum pad 1d is controlled to be extended towards the opening 11a and inserts the wafer A in the inner casing 12 through the opening 11a. When the wafer A is brought above the recess 12b, vacuum holding by the vacuum pad 1d is released. As a result, the wafer A rests on the three support pins 42. When the lift body and support pins 42 are moved downwardly, the wafer A is placed in the recess, the movable wall 20 moves down to the bottom of the inner casing 12, thus forming a closed room between the movable wall 20 and the recess 12b.

Next, washing of the wafer is performed. The washing is performed by supplying a first washing liquid (chemical liquid) from the supply/discharge section. The washing liquid is supplied through one or two lower fluid holes P1 and one or two upper fluid holes P2, and then the washing liquid discharged via the remaining fluid holes P1 and P2.

The washing liquid is supplied with a pressure of about 2 Kg/cm$^2$. Accordingly, the wafer floats from the bottom of the recess by being lifted by the liquid from the below and is also pressed down by the liquid from the above. Thus, the wafer keeps the floating state in the closed room without making contact with the upper surface of the recess 12b and the lower face of the movable wall 20. In this state, the wafer receives the fluid spout from the above and also from the below, thus being cleaned uniformly.

In addition, the washing liquid is supplied from the inclined fluid holes in the direction which the circumferential component of a force is generated onto the wafer. As a result, the wafer is rotated by the liquid pressure supplied form the above and from the below. Thus, the top and bottom surfaces of the wafer are cleaned more uniformly, and a reduction of unevenness of washing and shortening of washing period are completed.

The washing liquid discharged from the recess 12b is supplied to the filter 2a via pipes, and the filtered washing liquid is accommodated in the tank 2c, and then, pumped up by the pump 2b, returned to the treatment takn 10.

After the first washing (about 1-2 sec.) described above, the supply of the first washing liquid is stopped, and the washing liquid remaining inside the washing tank and on the wafer are removed. In particular, the supply system valves which supplied the washing liquid are switched over, and nitrogen gas is blown out via the supply system onto the wafer effectively while the wafer is rotated, and then the washing liquid is collected.

Next, rinsing is performed. Pure water is supplied as in the same manner as the first washing, and after a predetermined period of time, using the nitrogen gas, the pure water is blown away from the surface of the wafer. In this way, the washing liquid fitted on the wafer, washing tank, pipes and the like are rinsed. Unexpected chemical change that would be caused by a next washing liquid is thus prevented.

After the above steps, a second washing liquid is supplied from the supply/discharge section for the next washing in the same manner as described above. Float and rotation of the wafer occurs in the same manner as the steps taken before. The washing liquid is collected, the wafer is rinsed with pure water and the water is discharged. This washing process is repeated for several times depending upon the object of the washing liquid, and then drying is performed successively.

After these steps, the movable wall 20 is moved upward, so that the recess is opened above the wafer. The lift body 41 is next moved upwardly by the cylinder 48, and the wafer is pushed up by the support pins 42. Then, the vacuum pad 1d extends through the opening 11b to above the wafer, holds the wafer and carries out from the opening 11b, placing the thus washed wafer in the wafer basket 3b. The entire washing operation cycle is completed.

The outside of the treatment tank 10 is about 300 mm in length and width and about 190 mm in height, for example. Also, if the wafer is about 0.5-1.5 mm in thickness, the recess 12b can be as shallow as 5-7 mm in depth. With such dimensions, even though the amount of the washing liquid supplied to the tank 10 is small in the amount, the washing liquid can wash the entire surface of the wafer thoroughly. Thus, a little amount of washing liquid can clean the wafer completely.

A plurality of nozzles 51 and 52 for drying gas, such as nitrogen gas (one each shown in FIG. 5), are provided in the recess 12b and the movable wall 20, respectively, so that the gas is evenly distributed. Thus, a part of the washing liquid supply/discharge system can be alternatively used as the gas system.

The upper and lower fluid holes may be provided perpendicularly to the bottom of the recess 12b so that the wafer can be treated without rotation. Also, the support pin 42 may be provided so as to penetrate the bottom of the recess 12b as an element to avoid using the lower fluid holes P1.

As described above in detail, according to the present invention, the treatment tank is not required for every treatment process, as a result the entire apparatus can be small in size.

Furthermore, the fluid is supplied to the small closed room and from which discharged through separate holes at the same time, and the wafer is treated one by one, then pure fluid is supplied always around the wafer, thus unevenness of treatment does not occur, rapid and certain treatment is performed even though the wafer is large in diameter.

Moreover, the wafer can keep the floating state in the treatment tank by the fluid pressure when it is being treated, and the fluid can flow around the both sides of the wafer, resulting in no unevenness of washing and high washing efficiency. Also, the treatment tank can be compact, so that the washing liquid supplied into the washing tank can be utilized for washing operation without wasting it compared to prior art devices wherein the wafer is dipped in the washing liquid stored in the washing tank.

In addition, an unevenness of washing is more reduced by rotating the wafer, and vacuum drying can be achieved by exhausting the gase from the recess.

Also, according to the present invention, the wafer can be easily and certainly inserted into and taken out from the narrow recess in the treatment tank body, the chemical liquid remained in the penetrating part of the support pin can be eliminated by the drying gas, the leakage of fluid from the top end of the treatment tank body can be prevented, and the leakage of the fluid from the penetrating part of the support pin into the bottom of the tank body can be prevented.

It is possible to design different embodiments without departing from the spirit and scope of this invention, and it should be understood that the present invention is not limited to the embodiments described in the specification.

I claim:

1. A surface treatment apparatus for a semiconductor wafer comprising:
    a treatment tank body made of anti-corrosion material having a cylindrical inside with a vertical axis line, a circular recess substantially coaxial with the cylindrical inside and formed on upper surface of the bottom wall of the treatment tank body, a plurality of lower fluid holes opened in the recess and a horizontally long opening provided at a lower part of side wall of the treatment tank body, an anti-corrosion movable wall which is tightly and slidably inserted in the cylindrical inside of the treatment tank body, forming a closed room with the recess when contacting with the bottom wall of the treatment tank body and is provided with a plurality of upper fluid holes communicated with said closed room, an actuation means for moving the movable wall, at least three support pins vertically penetrating the bottom wall of the treatment tank body for horizontally supporting the wafer inserted in the recess, a first passage member through which the support pin slidably penetrates at near the top end and secured in the lower fluid holes, a second passage member secured at near the bottom end of the support pin, a lift body in a form of a short cylinder secured to the second passage member, a bellows made of anti-corrosion material and provided between the lift body and near the lower fluid holes of the treatment tank body, a connecting member for lifting as one body fitted onto outer surface of the lift body, a lifting means connected to the center of horizontal bottom surface of the connecting member, and a treatment fluid supply/discharge means connected to upper fluid holes and lower end of the lift body.

2. A surface treatment apparatus for a semiconductor wafer as claimed in claim 1 wherein:

at least a part of the upper and lower fluid holes incline to the bottom surface of the recess so that a circumferential component of a force is generated on the wafer due to a rapid flow of the fluid.

3. A surface treatment apparatus for a semiconductor wafer as claimed in claim 1 further comprising:

a another bellows made of anti-corrosion material provided between a circumferential edge of the movable wall and a top edge of the treatment tank body, and a cover tightly fitted on top of the treatment tank body.

4. A surface treatment apparatus for a semiconductor wafer as claimed in claim 1 further comprising:

a another bellows made of anti-corrosion material provided between near lower end of the support pin and near the lower fluid holes of the treatment tank body.

* * * * *